Figure 1:
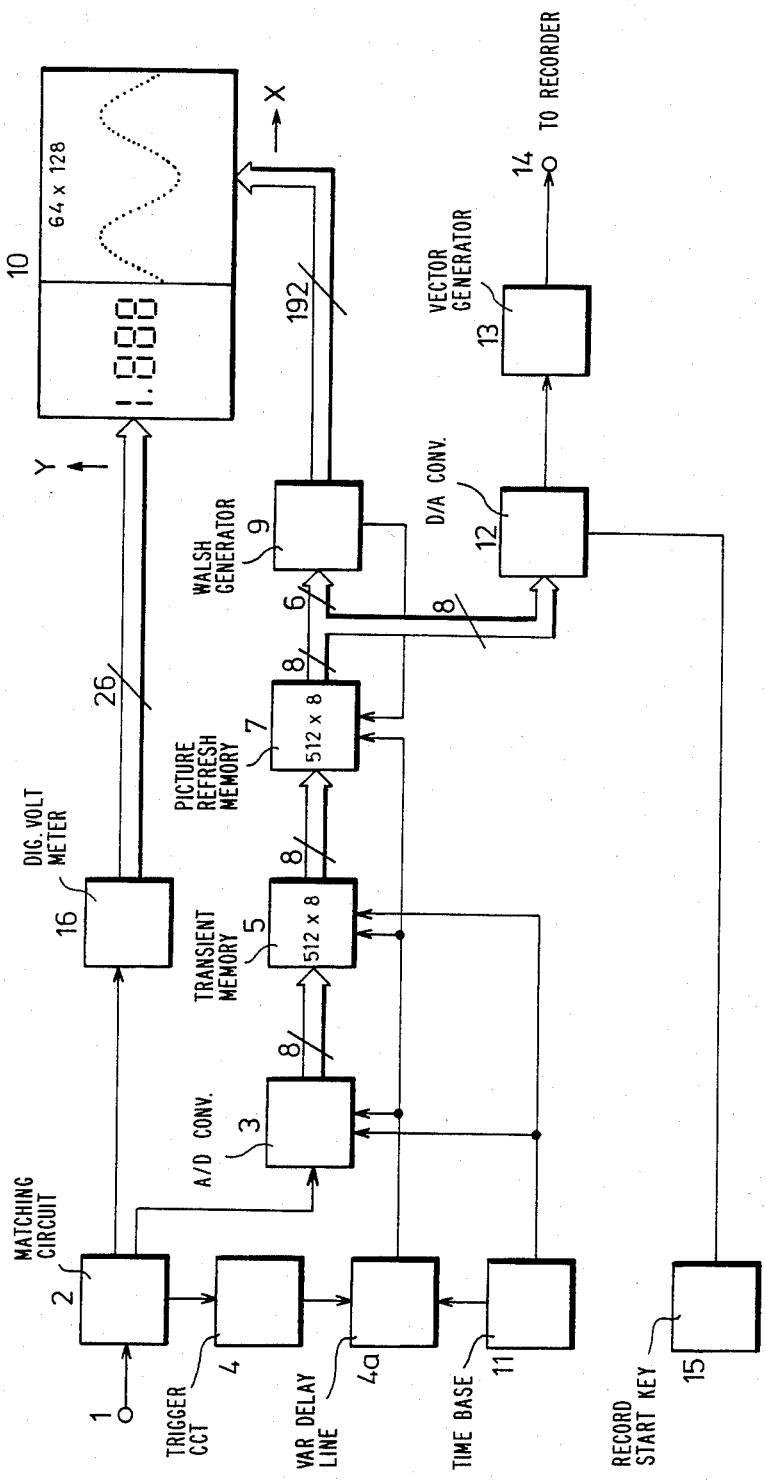

United States Patent [19]

Haussel et al.

[11] Patent Number: 4,510,444
[45] Date of Patent: Apr. 9, 1985

[54] DIGITAL MEASURING DEVICE WITH LIQUID-CRYSTAL PICTURE SCREEN

[75] Inventors: Werner Haussel, Feucht; Günter Roppelt; Robert Kindermann, both of Nuremberg, all of Fed. Rep. of Germany

[73] Assignee: Metrawatt GmbH, Nuremberg, Fed. Rep. of Germany

[21] Appl. No.: 385,003

[22] Filed: Jun. 4, 1982

[30] Foreign Application Priority Data

Jun. 6, 1981 [DE] Fed. Rep. of Germany ....... 3122558

[51] Int. Cl.³ ............................................. G01R 13/20
[52] U.S. Cl. .............................. 324/121 R; 324/99 D; 324/111
[58] Field of Search ................... 324/121 R, 112, 111, 324/99 D; 340/765, 784

[56] References Cited

U.S. PATENT DOCUMENTS

| 3,816,815 | 6/1974 | Schumann | 324/112 |
| 4,034,291 | 7/1977 | Allen et al. | 324/121 R |
| 4,114,095 | 9/1978 | Pankove et al. | 324/121 R |
| 4,271,391 | 6/1981 | Kmetz | 324/121 R |

FOREIGN PATENT DOCUMENTS 2806039 8/1979 Fed. Rep. of Germany .

OTHER PUBLICATIONS

E. Wunderlich, "Transient Memories, One of the Most Versatile Measuring Devices in Oscillography" in *Elektronik Praxis*, No. 12, Dec. 1969.

*Primary Examiner*—Stewart J. Levy
*Attorney, Agent, or Firm*—Herbert L. Lerner; Laurence A. Greenberg

[57] ABSTRACT

Digital measuring device, including a trigger generator having an input for receiving an analog measuring input signal, a variable delay line being connected to the trigger generator and having an output, an analog/digital converter receiving the analog measuring input signal, a transient memory connected to the analog/digital converter, a picture refresh memory connected to the transient memory for storing the measuring input signal, a Walsh function generator connected to the picture refresh memory, a liquid-crystal picture screen being connected to and addressed by the Walsh function generator, the output of the variable delay line being connected to the analog/digital converter, the transient memory and the picture refresh memory, and a selectable time base being connected to the variable delay line, the analog/digital converter and the transient memory.

5 Claims, 3 Drawing Figures

DIGITAL MEASURING DEVICE WITH LIQUID-CRYSTAL PICTURE SCREEN The invention relates to a digital measuring device with a liquid-crystal picture screen, which is driven by a Walsh function generator where the analog measuring input signal is fed through an analog-to-digital converter and is stored in a picture refresh memory, and the Walsh function generator is connected to the picture refresh mamory.

From German Published, Non-Prosecuted Application DE-OS No. 28 06 039, a liquid-crystal display device with an addressing device and a liquid-crystal element is known, which contains a two-dimensional matrix formed of line electrodes. In operation of the device, only one matrix element per column is always indicated and the indication of this matrix element always takes place if the difference between the signal voltages of the corresponding line and column electrodes is zero. Meanwhile, the difference of the signal voltages between the corresponding line and column electrodes of all other matrix elements has an r m s value different from zero. A signal voltage is applied to each of the line electrodes, which is independent of the indication signal to be displayed. These signal voltages form an orthogonal function system always having the same r m s value. At each of the column electrodes, one of the cell signal voltages is likewise present. The assignment of these signal voltages to the respective column electrode is controlled by the indicating signal to be displayed. The signal voltages are Walsh functions.

A disadvantage of this known liquid-crystal display device is that, if a trigger pulse occurs, only the waveshape after the pulse can be displayed ("post history"), but not the waveshape prior to the pulse ("prior history").

Based on this situation, it is accordingly an object of the invention to provide a digital measuring device with a liquid-crystal picture screen for displaying electric currents and voltages which are variable in time, which overcomes the hereinafore-mentioned disadvantages of the heretofore-known devices of this general type, and which makes it possible to store and display continuous signals and transient signals, where "prior history" and "post history" of the signals are to be recorded.

With the foregoing and other objects in view there is provided, in accordance with the invention, a digital measuring device, comprising a trigger generator having an input for receiving an analog measuring input signal, a variable delay line being connected to the trigger generator and having an output, an analog/digital converter receiving the analog measuring input signal, a transient memory connected to the analog/digital converter, a picture refresh memory connected to the transient memory for storing the measuring input signal, a Walsh function generator connected to the picture refresh memory, a liquid-crystal picture screen being connected to and addressed by the Walsh function generator, the output of the variable delay line being connected to the analog/digital converter, the transient memory and the picture refresh memory, and a selectable time base being connected to the variable delay line, the analog-digital converter and the transient memory.

The advantages obtainable with the invention are in particular that with the automatic display of current or voltage signals occuring once, such as interference pulses, the "prior history" of the once-occuring signal can also be displayed. The time relationship between the "prior history" and the "post history" to be displayed can be adjusted continuously. Recording of waveshapes with large common mode regions is further possible.

In accordance with another feature of the invention, the liquid-crystal picture screen has a numerical display, and including a digital voltmeter connected to the numerical display for receiving the input signal and passing the input signal to the numerical display. This makes it possible, besides the display of the waveshape of voltages and currents, to advantageously provide a simultaneous display of the r m s value or average value of the continuous signal on the digital numerical display of the picture screen as well.

In accordance to a further feature of the invention, there is provided a digital/analog converter connected to the picture refresh memory, a vector generator connected to the digital/analog converter, and a recorder output connected to the vector generator. In this way, a written documentation of the stored picture displayed on the picture screen is possible by means of a recorder.

In accordance with an added feature of the invention, the liquid-crystal picture screen has an time or X-axis with a given resolution, and the picture refresh memory has a memory depth being several times the required memory depth for increasing the given resolution of the X-axis of the liquid-crystal picture screen. Therefore, a "zoom effect" is advantageously achievable in the time domain.

In accordance with a concomitant feature of the invention, the liquid-crystal picture screen has a Y-axis with a given resolution, and the analog/digital converter, the transient memory and the picture refresh memory have data buses each being constructed for increasing the given resolution of the Y-axis of the liquid-crystal picture screen. In this way, a "zoom effect" can advantageously be obtained in the amplitude display.

Other features which are characteristic for the invention are set forth in the appended claims.

Although the invention is illustrated and described herein as embodied in a digital measuring device with liquid-crystal picture screen, it is nevertheless not intended to be limited to the details shown, since various modifications and structural changes may be made therein without departing from the spirit of the invention and within the scope and range of equivalents of the claims.

Figure 2:
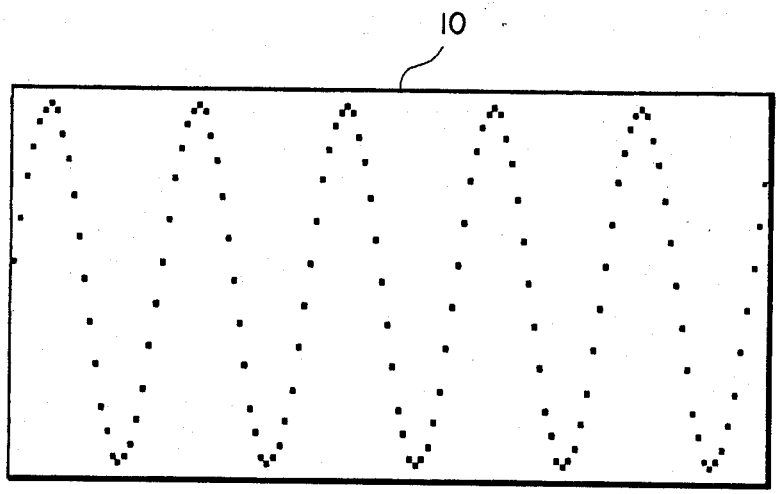
Figure 3:
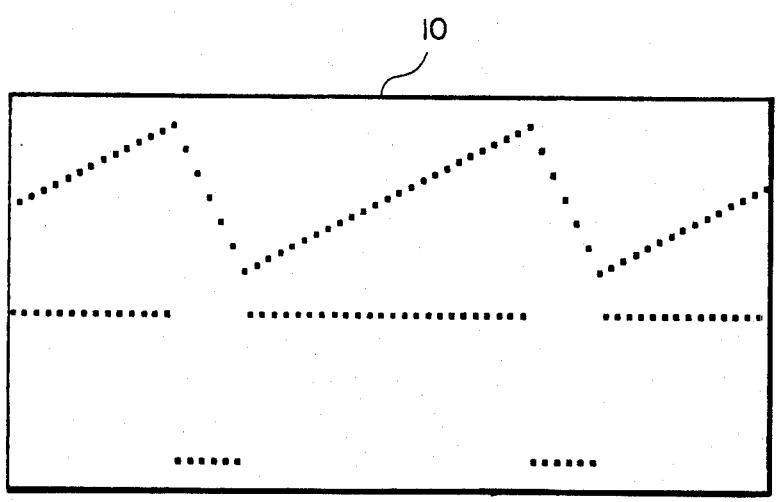

The construction and method of operation of the invention, however, together with additional objects and advantages thereof will be best understood from the following description of specific embodiments when read in connection with the accompanying drawings, in which:

FIG. 1 is a diagrammatic and schematic block circuit diagram of a digital measuring device with a liquid-crystal picture screen and transient memory according to the invention; and FIGS. 2 and 3 are persentations of waveshapes on the picture screen.

Referring now to the figures of the drawing and first particularly to FIG. 1 thereof, there is seen a digital measuring device with a transient memory and a liquid-crystal picture screen. The measuring device has a measuring input 1 which is connected to an input matching device 2. On the output side, the input matching device 2 is connected on one hand to an analog/digital converter 3, and on the other hand to a trigger 4. The analog/digital converter 3 is connected through a cable, such as an 8-conductor cable, to a transient memory 5. The transient memory 5 may, for instance, have a storage capacity of 512×8 bits and is connected through an 8-conductor line to a picture refresh memory 7. The picture refresh memory 7 may also have a storage capacity of 512×8 bits, for instance. The picture refresh memory 7 and the transient memory 5 are preferably in the form of CMOS-RAMs.

The picture refresh memory 7 is connected through a conductor line, such as a 6-conductor line, to a Walsh generator 9. The Walsh generator 9 is connected through a 192-conductor line to a liquid-crystal picture screen 10. The liquid-crystal picture screen 10 has 64×128 picture elements which are combined in a dot matrix with 64 lines (amplitude display) and 128 columns (time domain).

A variable delay line 4a is connected to the trigger 4. The delay line 4a is connected on the output side thereof to the analog/digital converter 3, the transient memory 5 and the picture refresh memory 7. A line coming from the Walsh generator 9 is further connected to the picture refresh memory 7. Signals of a switchable time base 11 are fed to the input side of the variable delay line 4a. The time base 11 is connected on the output side thereof to the analog/digital converter 3 and the transient memory 5.

The picture refresh memory 7 is connected through an 8-conductor line to a digital/analog converter 12. A vector generator 13 is connected to the converter 12. A recording output 14 is connected to the vector generator 13. The digital/analog converter 12 is furthermore connected to a recorder starting key 15. A non-illustrated recorder is connected to the recorder output. The input matching device 2 is furthermore connected to a digital voltmeter 16 which is connected, for instance, through a 26-conductor line to a numerical display part of the liquid-crystal picture screen 10. The numerical display part of the picture screen 10 is formed, for instance, of a 3.5 digit, 7 segment display.

The operation of the digital measuring device is described hereinbelow. The input signal is brought to the voltage level which can be processed by the analog/-digital converter 3 by the measuring input 1 and the input matching device 2. The input matching device 2 contains series resistors and current shunts for matching, which are switched by measuring range switches. The analog/digital converter 3 samples the waveshape and loads the transient memory 5 accordingly. The conversion frequency of the converter 3 corresponds to that frequency with which the digital words are written into the transient memory 5 and can be adjusted by the switchable time base 11.

The transient memory stores information continuously. If the memory 5 is full, its contents are written over by new information. This occurs until a signal with a trigger level appears. If the variable delay line 4a is set in such a way that the trigger signal is not delayed, the analog/digital conversion and the storing of the information into the transient memory 5 is interrupted and the previously stored information is transferred to the picture refresh memory 7. The information can then be read out independently of the transient memory 5 and independently of the time base set by the Walsh generator 9 from the picture refresh memory 7, and the information can be displayed on the picture screen 10, while information is already being written into the transient memory 5, until the next trigger signal is present. Additionally, the content of the picture refreshing memory 7 can be written out by pushing the recorder starting key 15. The individual picture elements are connected to each other by linear interpolation.

By setting a delay of the trigger signal at the variable delay line 4a, the length of the stored prior and post history (pre and post trigger) of the releasing signal can be determined. If the maximum delay time is set (sampling time, number of storage locations), only the post history of the releasing signal is transferred into the picture refresh memory 7; if the minimum delay time is set, only the prior history of the triggering signal is transferred into the picture refresh memory 7. The picture refresh memory 7 is necessary particularly because the picture screen 10 requires fixed, non-changeable picture repetition rates (making picture information ready) for the display of a fixed picture. Through the use of the transient memory 5, the writing in of the picture information into the picture refresh memory 7 advantageously takes only very little time, independently of the chosen time base. In the case of large time bases, the picture transferred into the picture refresh memory 7 stays, until the new picture is transferred after a trigger pulse.

With the aid of the delay line 4a, the ratio between prior and post history to be displayed can be divided up variably.

For a further explanation of the operation of transient memories for storing continuous or one time signals, reference is made to the publication "TRANSIENT MEMORIES, ONE OF THE MOST VERSATILE MEASURING DEVICES IN OSCILLOGRAPHY", E. Wunderlich, Elektronik-Praxis, Number 12/December 1969, Vogel-Verlag Würzburg. The transient memories described there, however, cannot be displayed. They must be operated in conjunction with oscilloscopes or recorders. These are disadvantageously large and heavy equipment which can only be operated with line power.

An increase of the resolution (zoom effect) in the time axis (X-axis) as well as in the amplitude axis (Y-axis) of the liquid-crystal picture screen 10 by a factor f is achieved by constructing the analog/digital converter 3, the transient memory 5 and the picture refresh memory 7 such that the digital magnitude of the signal applied to the X-axis and the digital signal applied to the Y-axis can be amplified in magnitude by the factor f as described in more detail, hereinbelow.

For characterizing the amplitude and its display on the Y-axis of the liquid-picture screen 10 (64 picture elements), only 6-bit words are properly required. The analog/digital converter 3 and the following memories 5 and 7, however, are laid out for an 8-bit word width. By shifting the 6-bit data bus on the output side to the 8-bit bus on the input side in the picture refresh memory 7, the resolution of the picture screen 10 in the amplitude axis is therefore changed.

The maximum resolution is obtained with the following setting:

| Data bus at the input of the picture refresh memory 7 | Data bus at the output of the picture refresh memory 7 |
| --- | --- |
| $2^7$ - - - | |
| $2^6$ - - - | |
| $2^5$ - - - | - - - $2^5$ |

-continued

| Data bus at the input of the picture refresh memory 7 | Data bus at the output of the picture refresh memory 7 |
|---|---|
| $2^4$ - - - | - - - $2^4$ |
| $2^3$ - - - | - - - $2^3$ |
| $2^2$ - - - | - - - $2^2$ |
| $2^1$ - - - | - - - $2^1$ |
| $2^0$ - - - | - - - $2^0$ |

An average resolution is obtained with the following setting:

| Data bus at the input of the picture refresh memory 7 | Data bus at the output of the picture refresh memory 7 |
|---|---|
| $2^7$ - - - | |
| $2^6$ - - - | - - - $2^5$ |
| $2^5$ - - - | - - - $2^4$ |
| $2^4$ - - - | - - - $2^3$ |
| $2^3$ - - - | - - - $2^2$ |
| $2^2$ - - - | - - - $2^1$ |
| $2^1$ - - - | - - - $2^0$ |
| $2^0$ - - - | |

The maximum resolution is obtained with the following setting:

| Data bus at the input of the picture refresh memory 7 | Data bus at the output of the picture refresh memory 7 |
|---|---|
| $2^7$ - - - | - - - $2^5$ |
| $2^6$ - - - | - - - $2^4$ |
| $2^5$ - - - | - - - $2^3$ |
| $2^4$ - - - | - - - $2^2$ |
| $2^3$ - - - | - - - $2^1$ |
| $2^2$ - - - | - - - $2^0$ |
| $2^1$ - - - | |
| $2^0$ - - - | |

For changing the resolution in time on the X-axis of the liquid-crystal picture screen 10, the memory depth of the picture refresh memory 7 is constructed for several times (for instance 4 times) the properly required memory depth (128 bits). In the embodiment example, the memory depth of the memory 7 is 512 bytes. By shifting the adress bus in the picture refresh memory 7, the time resolution is changed.

For a compact display of the entire memory area of the memory 7 on the picture screen 10, only every fourth address is displayed. For this purpose, the following setting is required:

| Addresses at the picture refresh memory 7 | Address counter of the picture screen 10 |
|---|---|
| $2^8$ - - - | - - - $2^6$ |
| $2^7$ - - - | - - - $2^5$ |
| $2^6$ - - - | - - - $2^4$ |
| $2^5$ - - - | - - - $2^3$ |
| $2^4$ - - - | - - - $2^2$ |
| $2^3$ - - - | - - - $2^1$ |
| $2^2$ - - - | - - - $2^0$ |
| $2^1$ - - - | |
| $2^0$ - - - | |

By means of an encoding switch, one quarter of the memory area is successive displayed with four-times resolution, which corresponds to an expansion of the time base by a factor of 4. The following setting results:

| Addresses at the picture refresh memory 7 | Address counter of the picture screen 10 |
|---|---|
| $2^8$ - - - | - - - Encoding Switch |
| $2^7$ - - - | |
| $2^6$ - - - | - - - $2^6$ |
| $2^5$ - - - | - - - $2^5$ |
| $2^4$ - - - | - - - $2^4$ |
| $2^3$ - - - | - - - $2^3$ |
| $2^2$ - - - | - - - $2^2$ |
| $2^1$ - - - | - - - $2^1$ |
| $2^0$ - - - | - - - $2^0$ |

The encoding switch setting in this case is as follows:

| Encoding switch | Addresses of the memory 7 |
|---|---|
| 00 | 0 . . . 127 |
| 01 | 128 . . . 255 |
| 10 | 256 . . . 383 |
| 11 | 384 . . . 511 |

The amplitude resolution as well as the time resolution can be changed in a picture which has already been stored.

The liquid-crystal picture screen 10 is controlled on one hand by the digital voltmeter, and on the other hand by the Walsh generator 9. The addressing principle of the liquid-crystal picture screen 10 by means of the Walsh generator 9 is known from German Published, Non-Prosecuted Application DE-OS No. 28 06 039, and reference is made thereto for the description of the operation thereof.

It is a feature of the addressing technique being used that the selected picture elements remain without voltage and that the same r m s voltage is present at all background elements, independently of the number of lines and columns. This voltage can be selected to be sufficiently high so that good contrast is obtained since in this case, the opto-electric characteristic of the liquid crystal is fully traversed.

In a dot matrix with n lines, n different binary voltage waveshapes (base functions) are generated independently of the picture (outputs of an n-stage binary counter). Through logical interconnection with the line number n, the line addressing signals are generated which form an orthogonal function system (Walsh functions) and are independent of the picture. For generating the column sequences, the above-mentioned n base functions are logically interconnected not only with the column number n but also with the picture information of the corresponding column. To simplify the electronics, the counter for the line number is combined with that of the column.

The essential advantage of this addressing technique is the low demands it makes on the liquid-crystal to be used in the picture screen 10. It must merely be noted that only one picture element per column can be displayed. In the case of fast rises, such as in step functions, connecting lines therefor are missing. Normal wave forms of currents and voltages, however, can be displayed well.

The vertical resolution (amplitude) of the picture screen 10 is limited by the resolution of the digitalization, and by the 8-bit analog/digital converter 3 in the embodiment example. This corresponds to an amplitude resolution of 256 dots. The resolution of the time base is limited by the memory depth of the memories 5 and 7.

The following relationship exists between the sampling rate $f_{sample}$ and the maximum frequency $f_{max}$ that can be displayed:

$$f_{max} = f_{sample}/K$$

(K = constant). The constant K assumes different values for different types of display. For a dot display as in the picture screen 10, K = 25.

For a real time display, where an analog/digital conversion is performed for each picture element shown, and a display of the sine curve on a dot matrix picture screen, a maximum frequency $f_{max}$ can therefore be processed which is 25 times lower than the sampling rate $f_{sample}$. In FIG. 2, a sine curve with 25 samples per period is shown. The sinusoidal character of the curve is still easily recognizable.

The picture screen 10 can also be used for displaying two waveshapes, where a picture element of one variable alternatingly follows a picture element of the other variable. FIG. 3 shows such a "chopper" operation.

For digital numeral display on the picture screen 10, the analog variable coming from the measuring input 1 is fed through the input matching device 2 to the digital voltmeter 16. There, it is processed either directly or through an r m s value converter. The digital voltmeter 16 also contains the analog/digital converter necessary for the processing, and the driver required for the numerical display.

By means of the digital/analog converter 12 and the vector generator 13, current and voltage waveforms can be written out. The address counter of the Walsh generator 9 is reset and the readout frequency of the picture refresh memory 7 is reduced to a value given by the recorder, so that the entire memory content is read out in a given time. By transferring the data from the memory 7 to the digital/analog converter 12, an analog value is assigned to each digital value. By means of the vector generator 13, the analog values are connected together by linear interpolation. For the vector display, the most advantageous value is obtained as K = 10, so that the bandwidth for the recorder output 14 is advantageously increased over the bandwidth of the picture screen 10. Of particular advantage is the fact that the curve to be written out is visible on the picture screen 10 prior to the recording operation. Therefore, a decision can be made prior to the writing operation as to whether or not a curve is to be written out. Savings of recording paper and recording time result from such a capability.

The recorder output 14 can also be laid out as an oscilloscope outout. The memory content of the memory 7 is then fed with the frequency of the Walsh generator to the digital/analog converter 12, is linearly interpolated by the vector generator 13, and is fed to the oscilloscope. Long term storage can be performed in the memories 5 and 7 by switching over the CMOS-RAMs used to standy operation reserve operation) in the switched off state of the measuring equipment. A suitable medium (paper, tape, floppy disc) is advantageously not necessary.

Due to its small size, its ease of handling and its low current consumption, the measuring device can be operated independently of the power line. The recording of one time processes, such as interference pulses, independently of the line, where the storage capacity of the measuring equipment is utilized, is of advantage. When making measurements independently of the power line, no direct coupling with the line power supply takes place and therefore a high degree of common mode suppression for common mode voltages is obtained. The power is supplied in this case by batteries.

The main field of application of the measuring device is in power engineering (high voltage and large current region). Partial areas would also be network disturbances, network failures, converter technology and power electronics, for instance. Further applications might be in the low frequency area, material testing, power line carrier frequency systems and bit pattern recognition.

The foregoing is a description corresponding to German Application No. P 31 22 558.6, dated June 6, 1981, the International priority of which is hereby claimed for the instant application, and which is hereby made part of this application. Any discrepancies between the foregoing specification and the aforementioned corresponding German application are to be resolved in favor of the latter.

We claim:

1. Digital measuring device, comprising a trigger generator having an input for receiving an analog measuring input signal, a variable delay line being connected to said trigger generator and having an output, an analog/digital converter receiving the analog measuring input signal, a transient memory connected to said analog/digital converter, a picture refresh memory connected to said transient memory for storing the measuring input signal, a Walsh function generator connected to said picture refresh memory, a liquid-crystal picture screen being connected to and addressed by said Walsh function generator, the output of said variable delay line being connected to said analog/digital converter, said transient memory and said picture refresh memory, and a selectable time base being connected to said variable delay line, said analog/digital converter and said transient memory.

2. Digital measuring device according to claim 1, wherein said liquid-crystal picture screen has a numerical display, and including a digital voltmeter connected to said numerical display for receiving the input signal and passing the input signal to said numerical display.

3. Digital measuring device according to claim 1, including a digital/analog converter connected to said picture refresh memory, a vector generator connected to said digital/analog converter, and a recorder output connected to said vector generator.

4. Digital measuring device according to claim 1, wherein said liquid-crystal picture screen has an X-axis with a given resolution, and said picture refresh memory has a memory depth being several times the required memory depth for increasing the given resolution of the X-axis of said liquid-crystal picture screen.

5. Digital measuring device according to claim 1, wherein said liquid-crystal picture screen has a Y-axis with a given resolution, and said analog/digital converter, said transient memory and said picture refresh memory have data buses each being constructed for increasing the given resolution of the Y-axis by a factor f of said liquid-crystal picture screen by increasing the digital magnitude of the digital signal applied to the Y-axis by said factor f.

* * * * *